US006113753A

United States Patent [19]
Washburn

[11] Patent Number: 6,113,753
[45] Date of Patent: Sep. 5, 2000

[54] SYSTEMS AND METHODS FOR MAKING A MAGNETIC RECORDING MEDIUM ON A FLEXIBLE METAL SUBSTRATE

[75] Inventor: Hudson Washburn, Santa Clara, Calif.

[73] Assignee: Flextor, Inc., San Jose, Calif.

[21] Appl. No.: 09/274,533

[22] Filed: Mar. 23, 1999

[51] Int. Cl.$^7$ .............................. C23C 14/34; B24B 1/00; G11B 5/012

[52] U.S. Cl. .................................. 204/192.15; 204/192.1; 204/192.2; 204/192.12; 204/192.11; 204/298.04; 204/298.23; 204/298.24; 204/298.25; 204/298.26; 204/298.15; 204/298.06; 242/917; 414/222; 414/225; 414/431; 414/432; 451/57; 451/63; 451/28; 451/64; 451/119; 451/162; 451/163; 451/177; 451/294; 451/331; 451/336; 451/337; 451/340; 451/360; 451/364; 451/365; 427/128; 427/129; 428/65.3; 360/97.01; 360/135

[58] Field of Search ............................ 204/192.2, 192.12, 204/192.15, 298.23, 298.24, 298.25, 298.26, 298.15, 298.06, 192.11, 192.1, 298.04; 242/917; 414/222, 225, 431, 432; 451/57, 63, 28, 64, 119, 162, 163, 177, 294, 331, 336, 337, 340, 360, 364, 365; 427/128, 129; 428/65.3; 360/97.01, 135

[56] References Cited

U.S. PATENT DOCUMENTS

| | | | |
|---|---|---|---|
| 4,260,466 | 4/1981 | Shirahata et al. . | |
| 4,300,209 | 11/1981 | Washburn . | |
| 4,335,183 | 6/1982 | Hosaka . | |
| 4,514,827 | 4/1985 | Washburn . | |
| 4,520,040 | 5/1985 | Cordts | 204/192.2 |
| 4,664,941 | 5/1987 | Washburn . | |
| 4,880,514 | 11/1989 | Scott et al. . | |
| 4,911,950 | 3/1990 | Horikoshi et al. . | |
| 5,036,629 | 8/1991 | Ishikuro et al. | 451/57 |
| 5,122,392 | 6/1992 | Takeuchi et al. . | |
| 5,486,276 | 1/1996 | Kitamoto et al. | 204/192.2 |
| 5,658,618 | 8/1997 | Schlatter et al. . | |
| 5,705,044 | 1/1998 | Washburn et al. | 204/298.25 |
| 5,762,766 | 6/1998 | Kurita et al. | 204/192.2 |
| 5,808,437 | 9/1998 | Schöb . | |
| 5,968,627 | 10/1999 | Nigam et al. | 428/65.3 |

*Primary Examiner*—Alan Diamond
*Attorney, Agent, or Firm*—Townsend and Townsend and Crew LLP

[57] ABSTRACT

A method is provided for processing a metal foil sheet to produce magnetic recording media. The method comprises providing an elongate metal foil sheet having a first side and a second side. The sheet is advanced through a plurality of processing stations in equal unit length segments such that each segment receives the same treatment to form a magnetic recording medium from each segment. Method are also provided to prepare the foil surfaces by polishing, texturing, cleaning, and stress relieving, to coat the prepared surfaces with at least one metal layer, to finish the coated layers by buffing, burnishing, and lubricating, and to form disk units from the prepared, coated and finished surfaces.

40 Claims, 5 Drawing Sheets

SYSTEMS AND METHODS FOR MAKING A MAGNETIC RECORDING MEDIUM ON A FLEXIBLE METAL SUBSTRATE

BACKGROUND OF THE INVENTION

This invention relates generally to the field of recording media, and in particular to systems and methods for making recording media. More specifically, the invention relates to novel ways to make flexible metal foil disks for storing computer data.

As known in the art, "hard" disk drives and "floppy" disk drives are the two major systems currently utilized with magnetic recording media. Copending U.S. patent application Ser. No. 09/007,452, filed Jan. 15, 1998 U.S. Pat. No. 5,968,627 the disclosure of which is herein incorporated by reference, describes exemplary metal foil disks for high data density recording. As described in that application, such metal foil disks are constructed differently than both conventional "hard" or rigid disks and "floppy" disks and offer an alternative to traditional storage media.

Rigid disks are formed by cutting a metal sheet and rod into individual circular shapes called substrate blanks and then subsequently processing the blanks by a set of discrete process steps. These process steps include steps to size and shape the substrate, polish, plate, texture, clean, coat by either vacuum deposition or spin coating, post-coat process, including lubrication, burnishing, inspection and testing. At each of these steps the disks are handled individually, either manually or by automated handling mechanisms. Such individual disk handling, whether manually or robotically, greatly increases the cost of the hard disk.

Floppy disks are processed in web form where a long sheet of the base material, typically mylar, is continuously passed through processing steps to clean, coat, dry, and lubricate the material. The disk shape is cut from the sheet after most of the processing is complete. This "web coating" process results in very inexpensive processing. See also, U.S. Pat. No. 5,122,392, the disclosure of which is herein incorporated by reference. However, such "web coating processes" produce disks with recording performance significantly inferior to hard disks. For example, the starting polymer material used to make the floppy disk cannot sustain the high temperatures typically used in the vacuum sputter deposition processes used for hard disks. Indeed, this is a key reason why the films applied to traditional floppy disk substrates have coercivities much lower than current hard disk processes. Due to the low degree of coercivity of the magnetic recording film, the floppy disk is unable to store large amount of data compared to a hard disk.

For example, a typical 95 mm diameter hard disk currently holds over $4\times10^9$ bytes of data. In a hard disk drive this data can be read and written at a rate over $2\times10^7$ bytes per second. However, a typical "high-performance floppy" disk of 95 mm diameter holds only $2\times10^8$ bytes. These performance numbers are an order of magnitude less than the hard disk. In addition, during the coating operation for a floppy disk, the magnetic slurry must be continuously coated along the length of the sheet in order to create the uniformity required to make the finished disk properties acceptable.

Neither of the above two processes alone are well suited for producing thin flexible metal disks having the ability to store a high density of data. Hence, it would be desirable to provide systems and methods for making such thin flexible metal disks. The systems and methods should be efficient so that relatively large quantities of such disks may be economically produced.

SUMMARY OF THE INVENTION

The invention provides exemplary manufacturing systems and processes for making a thin-film magnetic recording disk on a flexible metal substrate. The invention describes how to handle a flexible substrate in a continuous manufacturing process line and further describes specific process steps within the line. In one aspect, a long continuous strip of the thin foil starting material is strung through a series of stations and is advanced the distance of one unit length segment for each consecutive cycle. The process stations perform discrete operations on each segment during the cycle. The foil sheet is then advanced one disk unit length segment at the end of each cycle. A series of clamps and advancement mechanisms are positioned along the line to securely hold the foil during processing and to advance the entire strip one segment each process cycle.

General processes along the path of the manufacturing line include substrate preparation, thin-film coating, and post-coat processing. Each of these general processes includes various specific steps which are positioned along the manufacturing line and are performed on each of the disk unit segments.

In one particular embodiment, the invention provides an exemplary method for processing a metal foil sheet to produce a magnetic recording media. According to the method, an elongate metal foil sheet having a first side and a second side is advanced through a plurality of processing stations. The sheet is advanced in equal unit length segments so that each segment receives the same treatments. In this way, a flexible metal recording medium is produced from each segment.

In one aspect, the sheet is advanced by clamping the sheet with a clamping mechanism and then moving the clamping mechanism by a unit length amount. Preferably, at least some of the segments are clamped between the advancing steps so that the segments remain secured during treatment. Conveniently, the sheet may be provided on a roll. As the sheet is advanced, additional sheet material is unrolled from the roll.

In another embodiment, the invention provides an exemplary process line which comprises a plurality of processing stations through which a metal foil sheet is adapted to pass. The line further includes a plurality of spaced apart clamping mechanisms to clamp and secure the sheet at selective locations. Further, at least one advancement mechanism is provided to move the sheet through the processing stations. Optionally, one or more of the processing stations may be disengaged while the sheet is advancing. For example, one or both of the processing mechanisms at a given station may be moved away from the sheet.

One of the processing stations preferably comprises a surface treatment station to smooth portions of both sides of the sheet. Smoothing preferable entails polishing and possibly texturing and flattening or stress relieving. Preferably, the smoothed portions are circular and are generally aligned with each other so that a disk may be subsequently formed from within the smoothed portions.

Another one of the processing stations preferably comprises a coating station to coat the smoothed portions with one or more metal films or layers. A buffing station preferably follows the coating station to smooth the added metal layer. Finally, a disk forming station is employed to cut a circular disk from within the smoothed portions. Optionally, a stress relieving station may be provided to heat and cool the sheet to remove any residual stresses.

The invention further provides an exemplary method for producing a recording medium. According to the method, a thin metal foil sheet is processed to smooth a portion of both sides of the sheet. The smoothed portions are then heated and coated with one or more metal layers and overcoat layers, such as carbon, while under a vacuum. A disk is then removed from the smoothed portions to form a recording medium.

In one particularly preferable aspect, the portions are smoothed by rotating an abrasive surface on both sides of the sheet. In another aspect, the coated layers are buffed and/or barnished. For example, both sides of the sheet may be buffed after the layer or layers has been added. In still another aspect, the disk may be punched from the sheet. Alternatively, an inner diameter of the disk may be cut and a hub mounted within the inner diameter. An outer diameter is then cut which is concentric with the hub. During the process, the sheet is preferably advanced by unit length segments so that each segment receives the same treatment.

In still another embodiment, the invention provides a method for treating a metal foil sheet. The method utilizes a pair of pads which each comprise a compliant material and a abrasive surface on the compliant material. According to the method, the sheet is positioned between the pads, and the pads are forced against teach other to position the abrasive surfaces against the sheet. The pads are then rotated to produce smoothed portions on both sides of the sheet. Alternatively, the pads are mounted on mandrels which are in turn mounted so as to allow the facing substrates to comply to each other. This could be done, for example by using bearings or bushings that allow a small rotation of the mandrels to accommodate any non-parallelism between the mandrel front surfaces where the pads are mounted.

In one aspect, the pads are forced against the sheet to obtain a pressure in the range from about 2 psi to about 15 psi. The pads are preferably rotated at a rate in the range from about 60 rpm to about 1800 rpm. Preferably, the pads are rotated over an area that is larger than a disk region from which the disk is to be cut. In another preferable aspect, the center of rotation of the pads is moved during rotation to produce cross-angles on the smoothed portions.

Once the smoothed portions have been formed, the sheet is advanced and the process is repeated. Preferably, the sheet is clamped during application of the pads to secure the position of the sheet. For example, the sheet may be clamped between a pair of arms during smoothing. A mounting system may also be provided to mount the pads generally opposite each other. An actuation system may also be employed to force the pads against each other. Exemplary abrasive surfaces that may be employed include a polyester felt or other polishing pad material with a slurry polishing solution added to it. Another abrasive surface includes a firm backing material with abrasive particles attached to it, commonly referred to as "abrasive tape".

DETAILED DESCRIPTION OF THE SPECIFIC EMBODIMENTS

Figure 1:
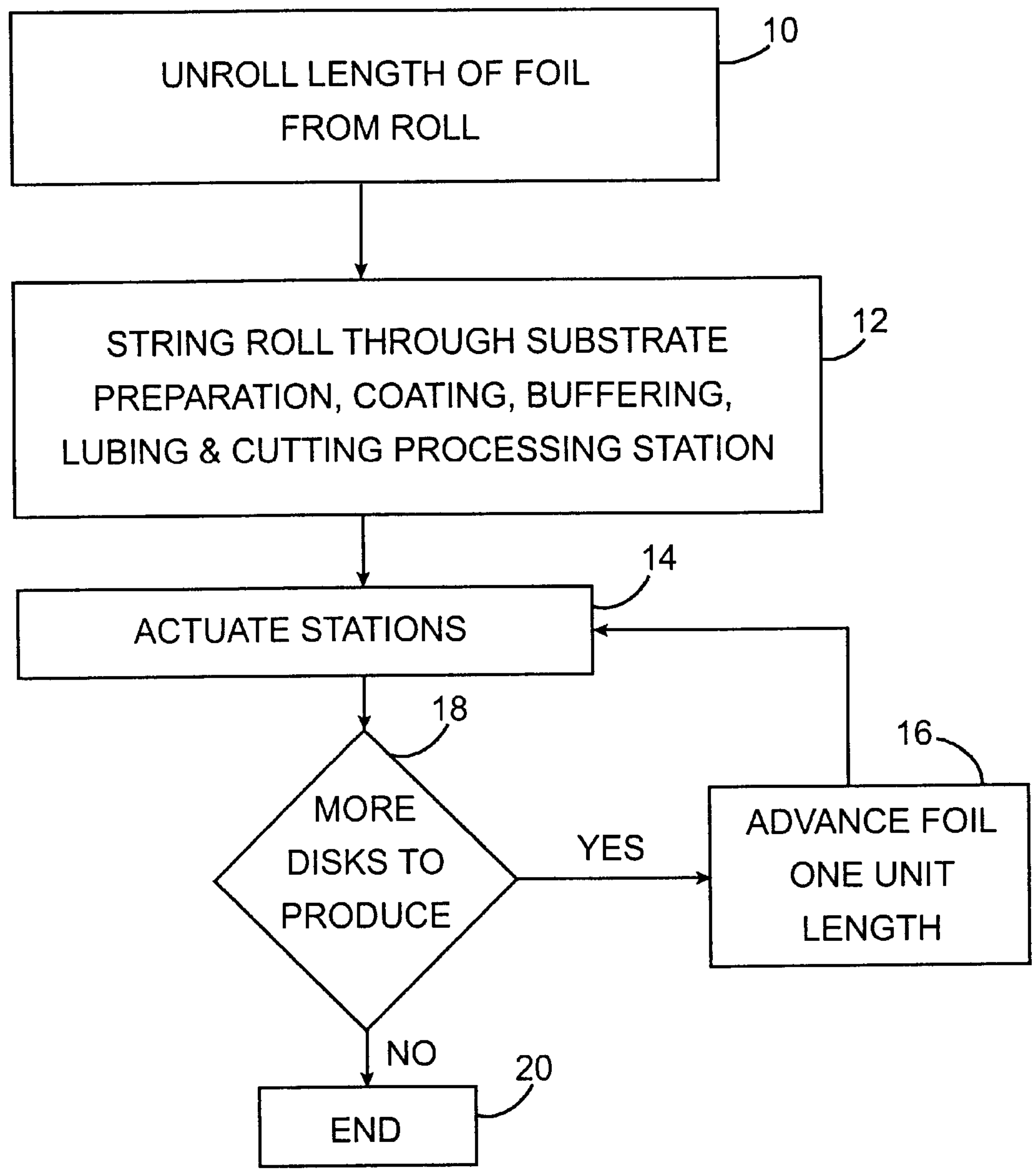
FIG. 1 is a flow chart of an exemplary method for producing recording media according to the invention.

The invention provides exemplary systems and methods for producing magnetic recording media which utilize a flexible metallic substrate as generally described in copending U.S. application Ser. No. 09/007,452, filed Jan. 15, 1998, U.S. Pat. No. 5,968,627 previously incorporated by reference. An overview of the process for producing such recording media is set forth in FIG. 1. Preferably, the starting material from which the substrate is to be constructed is a metal foil which is provided on a roll. As shown in step 10, a length of foil is initially unrolled from the roll. As shown in step 12, the unrolled length is strung through various processing stations, including a substrate preparation station, a coating station, a buffing station, a lubing station, and a cutting station. Once properly strung, all of the stations are actuated as shown in step 14. To continue the process, the foil is advanced one unit length as shown in step 16 and the stations are again actuated. This process is repeated as many times as necessary as shown in step 18 to produce the desired number of disks. Once completed, the process ends as shown in step 20. Hence, by advancing the foil one unit length, each segment of the foil sequentially passes through each station so that a disk may be produced from each segment.

Figure 2:
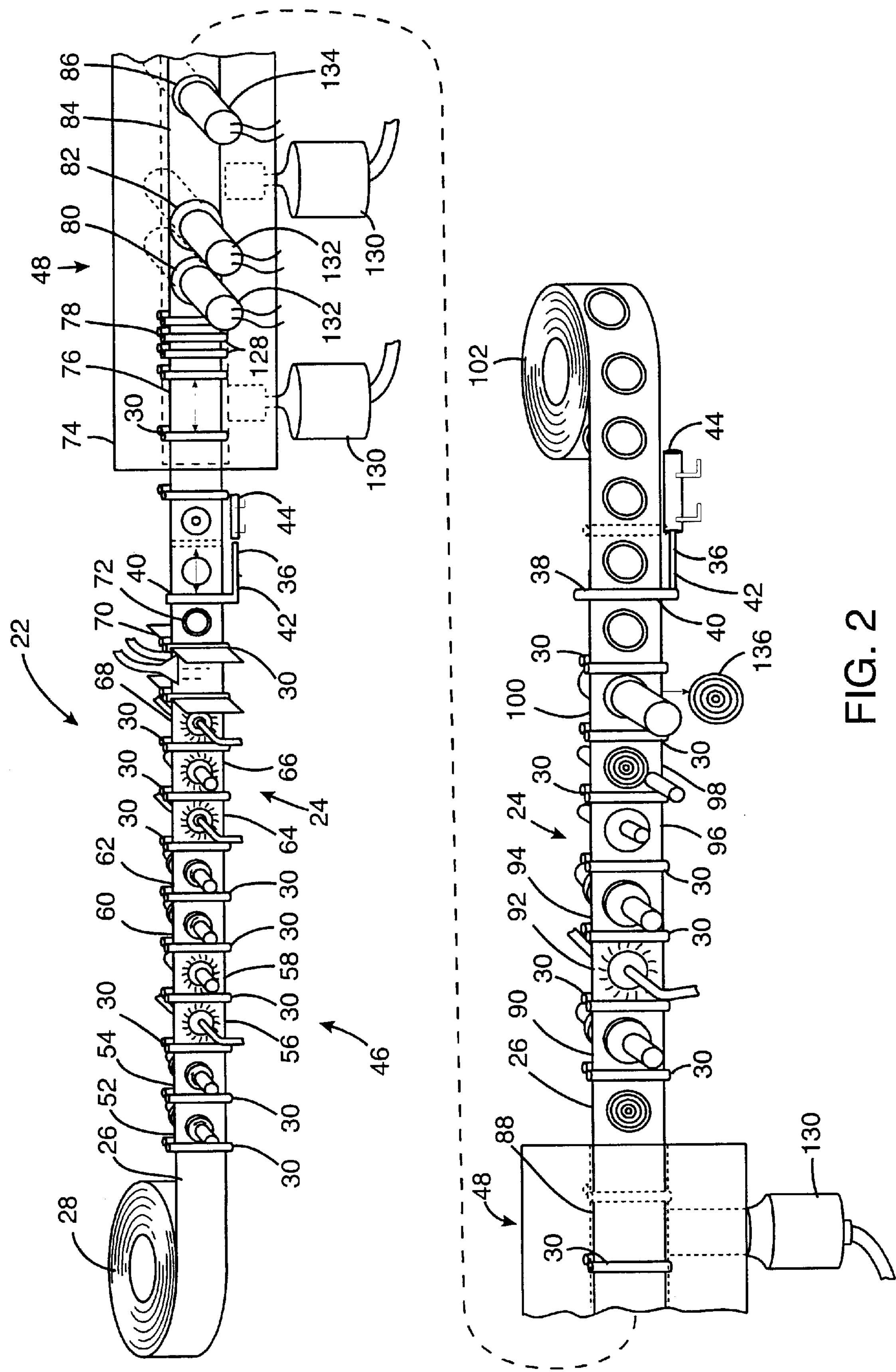
FIG. 2 is a schematic diagram of an exemplary manufacturing line for producing recording media according to the invention.

Referring now to FIG. 2, one exemplary system 22 for producing magnetic media will be described. System 22 comprises a manufacturing line 24 along which a metal foil strip 26 is passed. Preferably, metal foil strip 26 is stored on a coil or supply roll 28 as is known in the art. Foil 26 preferably has a thickness that is less than about 0.005 inch, and more preferably less than about 0.0012 inch. Exemplary metal foils which may be utilized include nickel, nickel alloys, steel, stainless steel, Sandvik steel, beryllium, beryllium alloys, copper, copper alloys, brass, bronze, titanium, titanium alloys, aluminum and aluminum alloys.

As described in detail hereinafter, supply roll 28 turns to allow foil 26 to pass along line 24 as foil strip 26 is pulled or driven at various points along manufacturing line 24. Foil strip 26 preferably has a width that is wide enough to contain the diameter of at least one finished disk. In some cases, it may be desired to make strip 26 sufficiently wide to contain two or more disks. As shown, foil strip 26 passes through a plurality of processing stations. In the event that metal foil strip 26 is provided with a width that is sufficient to accommodate multiple disks, additional processing stations may be placed adjacent each other along the width of foil strip 26. Foil strip 26 may also conveniently be divided into unit length segments. A unit length segment is the repeat distance along foil strip 26, i.e., the distance moved each cycle. In this manner, at the end of manufacturing line 28, each segment contains one disk. As one example, if the finished disk diameter were 85 mm, then the width of foil strip 26 (when accommodating a single disk along its width) is preferably between about 85 mm and 120 mm in width. The unit length segment is preferably between 90 mm and 125 mm. More preferably, the width is between 95 mm and 115 mm and the length is between 100 mm and about 120 mm. Each time foil strip 26 is advanced, it is moved by the unit length segment amount. Preferably, the processing stations are spaced apart by the unit length segment amount, or a multiple of this amount, so that each segment will be advanced to the next processing station each time foil strip 26 is advanced.

Figure 5:
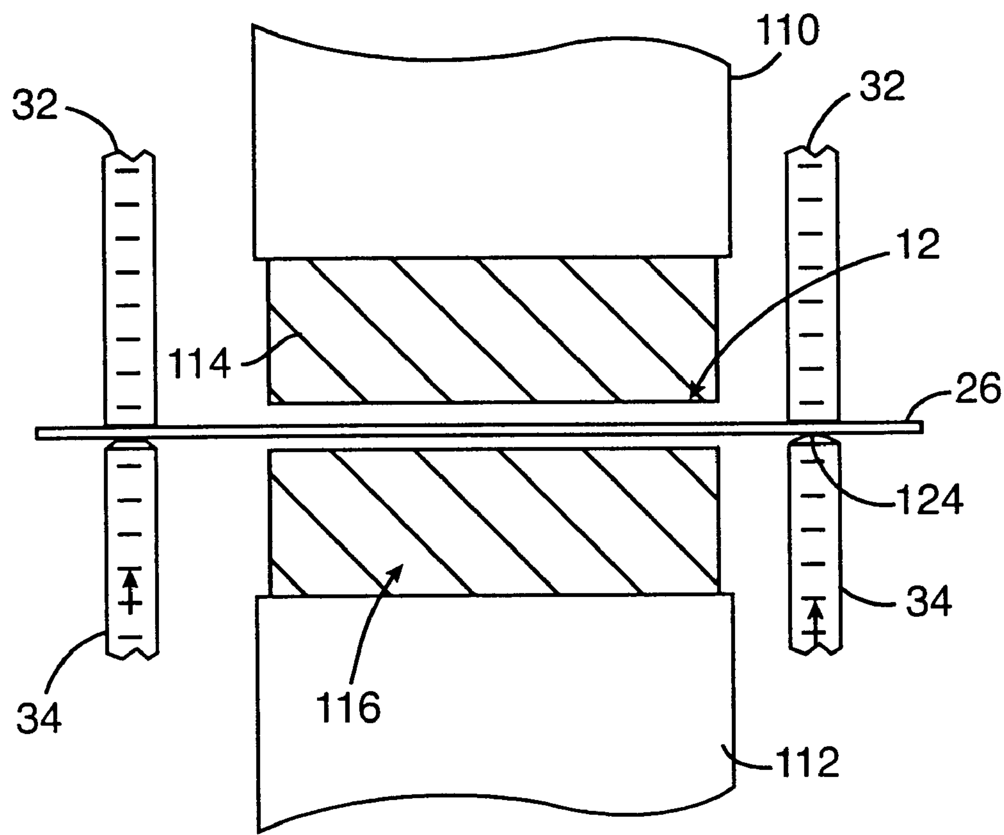
FIG. 5 is a cross-sectional view of the station of FIG. 4

Manufacturing line 24 includes a plurality of clamps 30 which are positioned at some or all of the processing stations. Clamps 30 are employed to rigidly hold foil strip 26 so that each segment within its respective processing station remains in a stable position during each cycle. After a cycle, clamps 30 release foil strip 26 to allow foil strip 26 to be advanced one segment to the next processing station where clamps 30 reclamp and cycle is repeated. As best shown in FIG. 5, each clamp 30 comprises a pair of arms 32 and 34. Optionally, arm 34 may be provided with a rounded surface to increase the clamping pressure. Although not shown, a pneumatic or other type of actuator is employed to move arms 32 and 34 together. As shown, arms 32 and 34 arc generally straight in geometry and extend the width of foil strip 26. However, it will be appreciated that other types of clamping mechanisms having other configurations may be employed. For example, clamps 30 may be configured to be circular in geometry, L-shaped in geometry (to produce a square about the segment), have flared ends, and the like.

Line 24 further includes one or more advancement mechanisms 36. As shown, line 36 includes two advancement mechanisms. However, it will appreciated that other numbers of advancement mechanisms may be employed, and may be positioned at one or more of the processing stations. Advancement mechanism 36 is conveniently constructed of a pair of arms 38 and 40 which are used to clamp foil strip 26 in a manner similar to clamps 30. A rod 42 is coupled to arm 40 and extends into a pneumatic cylinder 44. In this way, rod 42 may be retracted into cylinder 44 to advance foil strip 26 by one segment. After advancing foil strip 26, arms 38 and 40 are released and rod 42 is extended back to the home position so that a cycle may be repeated. Preferably, arms 38 and 40 are unclamped after clamps 30 have reclamped. Rod 42 is then returned to the home position so that foil strip 26 may be advanced at the end of the cycle as previously described.

Although not shown, holes may be punched in certain areas of foil strip 26 while at the first station. These holes serve as fiducial marks which identify the exact position of strip 26 and the location of each segment. The holes may be sensed with optical transmission sensors positioned along line 24. In this way, a quality control step is added to make sure that strip 26 is being advanced properly during each cycle.

Clamps 30 and advancement mechanisms 36 are advantageous in that they allow both sides of strip 26 to be accessed so that both sides of each segment may be processed simultaneously. Further, this manner of construction allows each segment to be processed individually, which is desirable when producing circumferentially symmetric finished disks. Further, the configuration of line 24 avoids contacting the surface area of each segment that will eventually comprise the final disk surface. Still further, line 24 is constructed so that strip 26 may be easily advanced to facilitate the production of large numbers of magnetic recording media in a continuous process.

One particular advantage of line 24 is that it allows for disks to be processed in an automated manner without requiring individual disk handling, thereby reducing the cost to produce the disks. Further, by utilizing foil strip 26 as the substrate material, costs may also be reduced. One advantage of using a thin metal foil is that it may be wound into coil 28 and unwound when needed without causing the foil to take a curved shape. In this way, the stable flying characteristics of the finished disk are preserved. Further, line 24 allows the finished disks to achieve the high recording performance associated with rigid disk substrates. Such recording performance is achievable by utilizing a continuous length of metal foil that is stopped at each processing unit so that the disks are not required to be individually handled throughout line 24. The use of a metal foil substrate also allows the disks to be heated before coating in a vacuum system. This also allows the finished disks to achieve a preferred magnetic recording film as found on traditional hard disks.

Still referring to FIG. 2, line 24 includes a substrate preparation section 46, a coating section 48, and a post coat processing section 50. In substrate preparation section 46, various processing stations are provided to perform one or more of the steps of polishing, texturing, cleaning, rinsing, drying, stress relieving, and chemical surface treatment, such as etching or conversion. Section 46 may also include measurement and characterization steps, such as thickness measurement or optical roughness measurement. Station 46 may also optionally include a feedback mechanism by which the amount or process condition of a given step applied to each individual segment could depend on an earlier measurement. As shown in FIG. 2, substrate preparation section 46 includes a coarse polish station 52, a fine polish station 54, a rinse station 56, a scrub clean station 58, a coarse texture station 60, a fine texture station 62, a rinse station 64, a scrub clean station 66, a rinse station 68, and a dry station 70. However, it will be appreciated that line 26 may operate with only some of the stations, or with other alternative stations. After a segment of foil strip 26 passes dry stations 70, the segment includes a smooth portion 72.

Coating section 48 is utilized to pass foil strip 26 (or substrips as described hereinafter) through a vacuum coating system 74 which heats foil strip 26, deposits one or more metal layers on strip 76 (typically by sputtering), cooling foil strip 26, depositing a protective overcoat, such as carbon by sputtering or ion beam deposition, and then removing strip 26 from system 74. As shown in FIG. 2, system 74 includes a vacuum lead-in station 76, a heat station 78, a deposit under layer station 80, a deposit magnetic layer station 82, a cooling station 84, a deposit overcoat station 86, and an exit station 88. However, it will be appreciated that other types of stations may be included within the vacuum coating system 74.

Post-coat processing section 50 includes stations which complete the processing of foil strip 26 and form it into a disk. Steps that may be included within section 50 include one or more burnishing operations using an abrasive tape, lubrication, buffing, cleaning, optical inspection, and forming the finished disk shape. As shown in FIG. 2, post coat processing section 50 includes an abrasive burnish station 90, a lubrication station 92, a buffing station 94, an inner-diameter punching station 96, a hub attachment station 98, and an outer diameter punching station 100. After station 102, foil strip 26 is coiled on a take-up roll 102.

System 22 of FIG. 2 illustrates one exemplary configuration for a disk manufacturing line. However, it will appreciated that alternative configurations may be utilized within the scope of the invention. As one example, one or more duplicate stations of any given process step may be placed adjacent to each other. Such a configuration would allow the net process cycle to be optimized for a given manufacturing line. For example, if one process step uses a process time which is twice as long as another step, then two adjacent stations may be utilized for the first process. The two adjacent stations each accomplish half of the processed step so that after two cycles the first process step is finished. In this way, shorter processing times may be used for the remaining processing stations. Hence, by multiplexing process steps in this manner, a high throughput rate may be achieved.

This type of "duplication multiplexing" may also be used to process more disks between maintenance operations. For instance, if one sputter target in the coating system can be used to coat a certain number of disks, then by using two consecutive stations with the same target and depositing half the coating in one and half in the other, or by using one target to its end of life and then using the other to the end of its life, the manufacturing line may coat twice as many disks before the targets need to be changed in a normal maintenance operation. Similarly, for the polishing stations, if one polishing pad may be used on a certain number of disks before it needs to be maintained, such as by cleaning or changing, then using two stations would allow twice the number of disks to be processed. Either processing half the process time on each station or using one station for a certain number of cycles, then using the second station for another certain number of cycles, would accomplish this objective. Further, while the second station is being used, the pads on the first station can be serviced so that the lime may continue uninterrupted.

Figure 3:
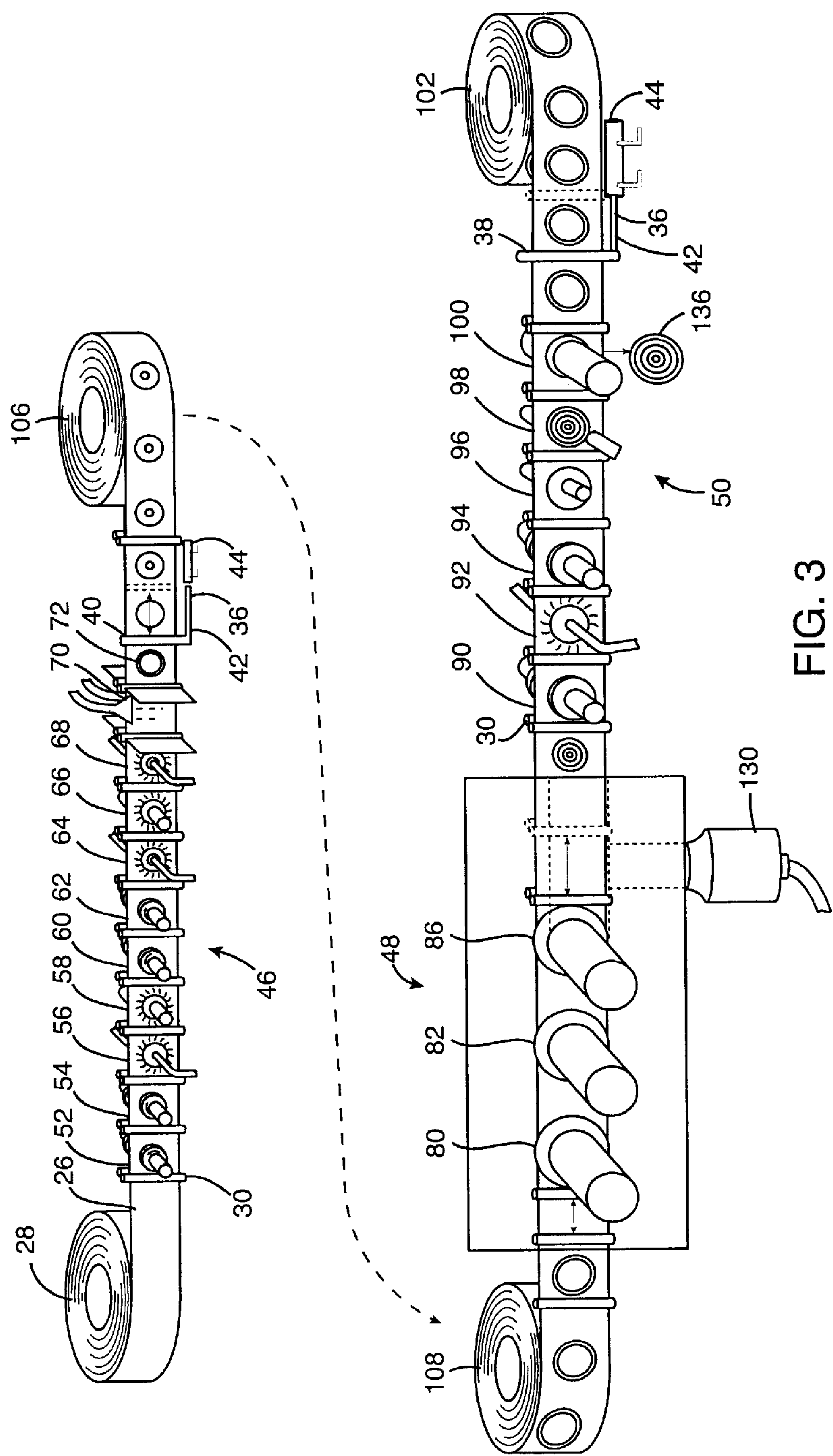
FIG. 3 is a schematic diagram of an alternative manufacturing line according to the invention.

As an alternative to utilizing a single continuous metal foil strip, the metal foil may be broken into smaller sections with take-up reels as needed, as shown in system 104 of FIG. 3. System 104 is essentially identical to system 22, except that take-up reels 106 and 108 are provided between substrate preparation section 46 and coating section 48. For convenience of illustration, identical elements in system 104 will utilize the same reference numerals utilized in system 22.

Although system 104 is shown with take-up reels 106 and 108, it will appreciated that system 104 may be broken into other segments utilizing other take-up reels as appropriate. One reason for breaking foil strip 24 into smaller sections is to facilitate the application of a bias voltage to the foil strip in vacuum coating system 74 without having the same voltage apply to the rest of line 24, or to better match through-put rates. For example, line 24 typically requires polishing and texturing times on the order of minutes, whereas the sputtering processes can be performed on the order of seconds. By employing multiple polishing and texturing stations to produce multiple reels of the metal foil strip, the through put of the substrate preparation section may be matched with the remaining sections. Moreover, by breaking of line 24 down into segments, manufacturing efficiencies may be increased because the malfunctioning of one section of line 24 will not significantly affect the operability of the other sections.

A variety of schemes may be provided to break line 24 into smaller sections. As just described, one way is the use of take-up reels. Alternatively, "idling" schemes may be employed. As an example, line 24 may include a serpentine path through which strip 26 is moved between substrate preparation section 46 and coating section 48. The serpentine path may be used to accommodate, for example, about 500–1000 segments. In this way, the serpentine path acts as a buffer between substrate preparation section 46 and coating section 48. Further, the serpentine path may be used to inventory any amount of strip length. Optionally, a slitting station may be provided after substrate preparation section 46 to electrically isolate substrate preparation section 46 from coating section 48. An attachment station, such as a spot welder, may be employed just before reaching vacuum coating system 74. In this way, the end of one substrip and the start of the next substrip would follow each other through the serpentine idler in a manner such that the two substrips are electrically isolated. However, as the two substrips come to the attachment section, a new substrip is slit at the slitting station and the two substrips would subsequently then be attached at the attachment station before this interface section is moved through coating system 74.

Preparation of the metal foil substrate requires a process that is different than that currently in use for either rigid disks or floppy disks. The method employed by the invention achieves a surface finish on the metal foil that is comparable to that obtained on a rigid disk substrate. However, with the process of the invention, the substrate is prepared in an automated process line so that the substrate may be prepared in a more cost efficient manner. The method utilized by the invention to prepare the substrate is illustrated generally in FIG. 4 which shows a more detailed view of coarse polishing station 54. However, it will appreciated that similar techniques are used for texturing and cleaning, as well as burnishing and buffing in the post-coat processing section.

Figure 7:
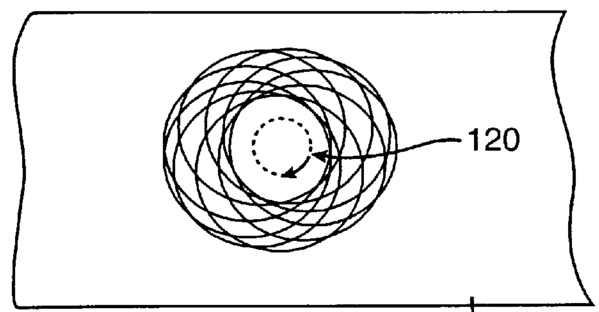
FIG. 7 illustrates a pattern of rotation of the pads of FIG. 6 according to the invention.

Station 52 includes a pair of generally rigid mandrels 110 and 112 which are positioned generally opposite to each other. Each mandrel includes a pad 114 and 116 (see FIG. 5) which include abrasive surfaces 122 and 124. To treat the substrate, mandrels 110 and 112 are rotated in opposite directions as shown by the arrows after clamps 30 have secured foil strip 26. Preferably, pads 114 and 116 are generally the same size so that both sides of foil strip 26 are provided with smooth regions that are approximately the same size and are generally aligned with each other. Pads 114 and 116 are preferably constructed of a compliant material, such as a polymer foam or a rubberized material that allows pads 114 and 116 to continuously remain in conformal contact with foil strip 26. As illustrated by arrows 118, mandrels 110 and 112 may be moved in a plane parallel to the plane of foil 26 during rotation. For example, as illustrated in FIG. 7, mandrels 110 and 112 may be moved so that the center of pads 114 and 116 moves in a circle 120. By moving mandrels 110 and 112 in this manner, cross-angles are produced in the smooth pattern as illustrated in FIG. 7 (it being appreciated that the amplitude of motion in the foil plane is exaggerated for purposes of illustration).

Although not shown, it will be appreciated that actuation mechanisms will be employed to move mandrels 110 and 112 toward and away from each other as well as to rotate mandrels 110 and 112. Further, a controller (not shown) is preferably employed to control operation of each of the processing stations as well as operation of clamps 30 and advancement mechanisms 36. In this way, all of the steps preformed within line 24 may be synchronized.

Figure 4:
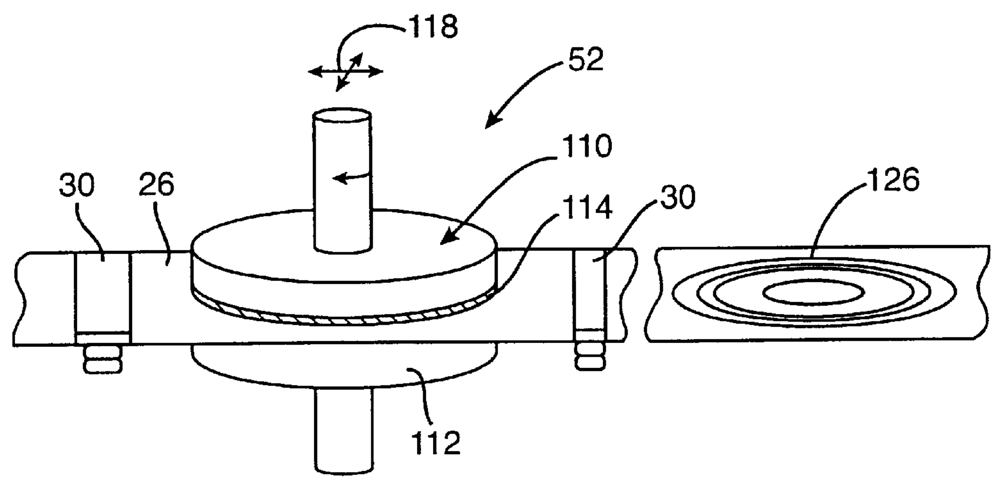
FIG. 4 is a schematic diagram of a surface treatment station of the line of FIG. 2.
Figure 6:
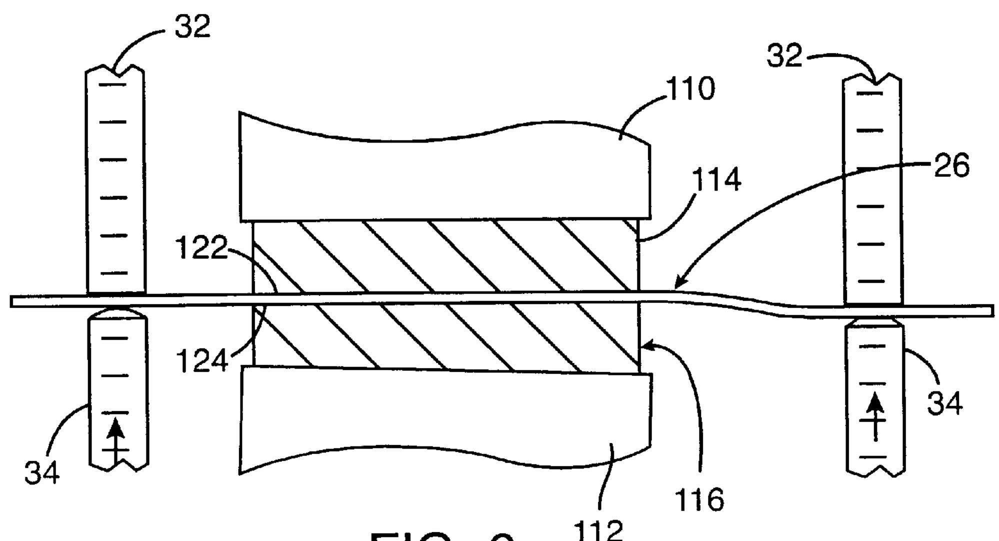
FIG. 6 illustrates the station of FIG. 5 with a pair of pads compressed against a sheet.

Operation of station 52 is illustrated in FIGS. 5 and 6. As shown in FIG. 5, mandrels 110 and 112 are in a home position where abrasive surfaces 122 and 124 are spaced apart from foil strip 26. In this way, foil strip 26 may be advanced at the completion of a cycle. Clamps 30 are actuated to securely hold foil strip 26 in place. As shown in FIG. 6, mandrels 110 and 112 are moved toward each other until foil strip 26 is compressed between pads 114 and 116. Mandrels 110 and 112 are rotated while abrasive surfaces 122 and 124 remain in contact with foil strip 26 to produce a smooth region 126 as shown in FIG. 4. When the operation is completed, mandrels 110 and 112 are moved away from each other, clamps 30 are released, and foil strip 26 is advanced the length of one segment.

Abrasive surfaces 122 and 124 continuously remain in contact with foil strip 26 because the compliant material used to construct pads 114 and 116 is able to accommodate any small non-parallelism between the opposing pads. The pressure forcing pads 114 and 116 against foil strip 26 may vary slightly around the circumference of the pads. However, this variation can be kept relatively small by keeping the parallelism within certain achievable limits and using a sufficiently thick compliant pad material. Hence, this allows the uniformity of the process and the resultant surface finish to be maintained within any desired range by the appropriate choice of tolerances and compliant material thickness and/or spring constant.

One example which illustrates that pads 114 and 116 are able to produce an acceptably smooth region even when not parallel is as follows. A Suba IV pad manufactured by Rodel, Inc., of Newark, Del. was employed to polish a length of foil strip. The pad was constructed of a polyurethane impregnated polyester felt having a thickness of about 1.4 mm. The foil polished was a brass foil 25 μm thick. The foil was 115 mm wide and was clamped firmly along the length of the foil strip 57 mm from the center of the segment. The polishing pads were 101 mm in diameter. The polishing pad on one side was tilted with respect to the pad on the other side so that there was 190 μm rise across the 101 mm wide pad. A pressure of 6 psi was applied to the pads with the foil between them, and a 1.0 micron alumina slurry manufactured by Baikowski International Corp. of Charlotte, N.C. was used to polish the foil. A pressure of 6 psi caused a net compression of the polishing pads of about 380 μm which was twice the tilt displacement. This resulted in an average compression of about 14% of the total pad thickness in the high pressure area of the pad, and about a 7% compression in the low pressure area. After polishing with a rotation rate of 150 rpm for three minutes, the surface roughness on the high pressure side was nearly the same as on the low pressure side of the foil. There was no visually discernable difference in the surface roughness characteristics when viewed under a optical microscope at 200×. This indicates the non-parallelism of the polishing pads are substantially compensated by the compliance in the compressible polishing backing material. Because of the compressibility of the backing material and the compliance of the foil, the foil conforms to the pad surfaces even though being held stable by the clamps. Hence, not only were the pads able to remain in contact with the surface of the foil at all times, the net polishing effect fell within reasonable limits of uniformity.

One example of how coarse polishing station 52 and fine polishing station 54 may be employed to polish a region on a stainless steel alloy foil is as follows. Station 52 employed the use of a Rodel Suba IV polishing pad as both the pad and the compliant backing. The foil was a 13RM19 stainless steel alloy manufactured by Sandvick Corp. of Sandviken, Sweden and was 35 μm thick and had a starting average surface roughness (Ra) of over 300 nm. The Suba IV pad had a 100 mm outside diameter and 10 mm inside diameter and was used on both sides of the foil with a Baikowski 3.0 μm colloidal alumina slurry. The slurry was applied to the foil/polishing pad interface and comprised a 33% by volume of a 30% hydrogen peroxide solution. A pressure of about 6 psi was applied to the pad on one side while the pad on the opposite side was held firm. The pads were rotated at 150 RPM (with a rate of 60 RPM to 1500 RPM being preferred) Additionally, the rotating pad was moved around a 10 mm diameter circle in a plane parallel to the foil at a rate of about 15 RPM. Polishing occurred for three minutes.

At station 54, a Rodel 204 pad and a Baikowski 1.0 μm alumina slurry with 30% hydrogen peroxide was employed. A pressure of between about 2 and 8 psi was applied and the pads were rotated at 150 RPM (with a rate of 60 RPM to 1000 RPM being preferred for three minutes. After this process, the Ra was measured to be 1.3 nm over an area of 15 microns by 5 microns as measured by a Digital Instruments atomic force microscope.

One advantage of utilizing rotating pads on a strip of metal foil to polish the disk substrate as previously described, is that there are essentially no "edge effects" on the flatness and surface finish of the finished disks. This is because the disk form is punched out of the foil after the polishing and texturing steps are completed. In contrast, current hard disk processes produce edges which include edge effects referred to as "duboff" and "edge effects". These edge effects are due to the mechanical effect of a polishing or texturing pad deforming near the edge of the disk and are well known in the industry. These effects result in the flatness near the edge of the disk being sufficiently worse than over the interior region of the disk. Further, the polish and texture characteristics vary significantly within the last 1–2 mm from the edge of the disk. These effects cause recording performance variations near the outer diameter which limit the usefulness of the outer area of the hard disk for magnetic storage. With the process of the invention, the outer edges of the polishing and texturing pads are kept well outside the region which later become the outer diameter of the finished disk. Also, the inner diameter of the polishing pads can be kept well inside the region which will later become the inner diameter of the finished disk. Hence, in the invention there are essentially no "edge effects" due to the polishing or texturing processes.

In some cases, stresses can develop in the metal foil strip after the polishing and texturing steps. Depending on the material and the process employed to polish and texture, it may be beneficial in some cases to relieve the stresses in the foil with a thermal process. For example, the foil strip may be passed through a chamber in which one or more heating elements are arrayed along the strip path that heat the strip to the desired temperature while it is held flat and rigid. The chamber may then be purged with an inert gas, or vacuum pumped, to provide a non-reactive atmosphere. The strip may then pass from a heating chamber section to a cooling chamber where the rate of cooling is controlled by controlling of the wall temperature, the chamber atmosphere, and the temperature of adjacent clamps. Alternatively, metal or glass plates with highly flat and smooth surfaces may be pressed against both sides of the foil surface and simultaneously heated to a high temperature so as to heat and flatten the critical area of the foil, thereby relieving stress and forming a flatter and smoother finished disk area.

The clamps throughout such a section are preferably temperature controlled and designed to make good thermal contact with the foil to help control the heat conduction along the foil strip. The entrance and exit are preferably cooled to maintain a low temperature near operating room temperature outside the chamber. Within the chamber, the clamps are preferably controlled to help obtain the desired stress relieving temperature and to maintain the proper cooling rate. Such stress relieving stations may be positioned anywhere along line 24 as needed.

As previously mentioned, coating section 48 is used to pass foil strip 26 into vacuum coating system 74 where it is coated with multiple layers and then passed out of the vacuum into the atmosphere. While within system 74, foil strip 26 is heated with resistive heaters 128 that are disposed in heating station 78. One or more metal layers is then coated in a vacuum deposition process, such as sputtering, in stations 80 and 82. An overcoat layer, such as carbon, is then deposited using sputtering or ion deposition at station 86. Cooling may optionally occur before and/or after the deposition of the overcoat layer. To create the vacuum within system 74, one or more vacuum pumps 130 are employed. Stations 80 and 82 also employ the use of sputtering sources 132. Station 86 also includes a sputtering source 134.

The sputtering sources are preferably circularly symmetric as generally used in coating systems, such as those described in U.S. Pat. No. 4,500,409, the disclosure of which is herein incorporated by reference. A magnetic field is applied using permanent magnets or electromagnet coils behind the targets. Simultaneously, a voltage is applied to the target that is negative 250 volts to about negative 900 volts relative to the surrounding walls. Additionally, a bias voltage may be applied to the metal foil substrate that is a negative zero to about a negative 400 volts relative to the surrounding walls. The sputtering is done in a atmosphere of gas at a pressure of about 1 millitorr to about 10 millitorr. The gas is preferably any of several commonly used sputtering gases, such as argon or argon with partial pressures of oxygen, nitrogen, krypton or xenon.

As previously mentioned, foil strip 26 may be cut into smaller segments before being introduced into vacuum coating system 74. For example, foil strip 26 may be cut into lengths of one or more unit length segments, up to the total length of the roll. Cutting of foil strip 26 into separate sections may facilitate processing within the sputtering system, such as when applying a bias voltage to the foil strip during the sputtering operation. A variety of processes may be employed to handle the sections of foil so that the foil within the sputtering system remains electrically isolated from the foil segment remaining in the substrate preparation line.

As previously described in connection with FIG. 3, the foil strip may be reloaded onto a coil or take-up reel at the end of the substrate preparation process. The foil may then subsequently be strung through the coating system. The foil on the take-up reel may then be feed from the outside of the coating system or be enclosed within the vacuum volume and fed from within the vacuum system. In another alternative, the foil strip may be continuously passed through a "holding maze" or serpentine path where it snakes back and forth as previously described. As another alternative, the foil strip may be cut into sections containing a small number of segments, such as about 1 to about 10, and mounted onto a pallet. These segments may then be processed through a "pass-by" type of system using a coater, such as a HD12 coater commercially available from Ulvac Corp. of Japan. This alternative utilizes available disk vacuum coating equipment, with a small loss in manufacturing efficiency. In still another alternative, the entire foil strip may be gathered from the substrate preparation section on a take-up roll. The vacuum system may then be opened and the entire roll placed in a vacuum entrance lock. The metal foil may then be threaded through the coater, either manually before closing the vacuum system or automatically with driven rollers or other automated equipment. The coated disks may then be rerolled into a coil form in an exit lock from which it may be removed when a new roll is to be entered into the entrance lock. Such a method is advantageous in that it avoids the atmosphere-to-vacuum section that may compromise the vacuum quality in the deposition sections.

In post coat processing section 50, pad burnishing or buffing steps are utilized, preferably employing a mildly abrasive pad to remove particulate, protrusions left by the sputtering process, and other high points remaining from the polishing, texturing, or other earlier substrate preparation processes. Preferably, the pad burnishing mechanism in station 90 is similar to the mechanisms used for the texture and polishing processes as previously described. Lubrication station 92 preferably sprays a fine mist of a lubricant containing fluid onto the foil strip, with buffing station buffing off any excess. Alternatively, foil strip 26 may be passed into and then back out of a tank of lubricating fluid. Optionally, an additional process step may include an inspection step where foil strip 26 is optically or magnetically scanned for defects and/or the magnetic properties of the films are measured.

In processes where foil strip 26 is cut into smaller segments as previously described, the post coat processes may be adapted to handle the shorter strips. This is preferably accomplished by utilizing handling mechanisms that automatically feed the shorter strips through the process stations. For example, if shorter strips are utilized, lubrication may be performed using modified versions of currently available dip lubers, such as those manufactured by the San Jose Die Company of San Jose, Calif., which are modified to suspend the foils in the lube tanks.

At the end of post coat processing section 50, a finished disk 136 is punched out of foil strip 26. Processes that may be employed to remove the disk include the use of a mechanical die punch, laser cutting, water jets, electrical discharge, or other cutting processes. Preferably, both an inner diameter and an outer diameter are formed. These cuts may be done simultaneously, or the inner diameter may be cut first followed by the outer diameter. Alternatively, as shown in FIG. 2, the inner diameter may be first cut and a central hub mounted into the opening. The outer diameter is then cut. This process is advantageous in that the outer diameter may be made concentric with the hub, thereby eliminating the need for accurately cutting the inner diameter to be concentric with the outer diameter and the need to attach the hub concentric with the inner diameter.

After disk 132 is cut into its final shape, it is subjected to various subsequent processing steps. For example, it may be mounted onto a central hub (if this was not already previously performed) inspecting the disk, glide testing, and electrical testing and formatting.

The invention has now been described in detail for purposes of clarity of understanding. However, it will be appreciated that certain changes and modifications may be practiced within the scope of the appended claims.

What is claimed is:

1. A method for processing a metal foil sheet to produce magnetic recording media, the method comprising:

providing an elongate metal foil sheet having a first side and a second side; and advancing the sheet through a plurality of processing stations in equal unit length segments such that each segment receives the same treatments to form a magnetic recording medium from each segment.

2. A method as in claim 1, wherein the advancing step comprises clamping a portion of the sheet with a clamping mechanism and moving the clamping mechanism a unit length amount.

3. A method as in claim 2, further comprising clamping at least some of the segments between the advancing steps.

4. A method as in claim 1, wherein the sheet is provided on a roll, and further comprising unrolling the sheet from the roll.

5. A process line, comprising:

a plurality of processing stations through which a metal foil sheet is adapted to pass;

a plurality of spaced apart clamping mechanisms which are adapted to clamp the sheet at selective locations; and at least one advancement mechanism which is adapted to move the sheet through the processing stations.

6. A line as in claim 5, wherein one of the processing stations comprises a surface treatment station which is adapted to smooth portions of two sides of the sheet which are generally aligned with each other.

7. A line as in claim 6, wherein one of the processing stations comprises a coating station which is adapted to coat the smoothed portions with at least one metal layer.

8. A line as in claim 7, wherein one of the processing stations comprises a buffing station which is adapted to smooth the coated layer.

9. A line as in claim 6, wherein one of the processing stations comprises a disc forming station which is adapted to cut a circular disk from within the smoothed portions.

10. A line as in claim 5, wherein one of the processing stations comprises a stress relieving station which is adapted to heat and cool the sheet to remove residual stresses.

11. A line as in claim 5, wherein the clamping mechanisms are spaced apart such that at least one clamping mechanism is adapted to clamp a unit length segment of the sheet.

12. A line as in claim 1, wherein the advancement mechanism is adapted to advance the sheet one unit length segment for each actuation.

13. A method for producing a recording medium, comprising:

providing a metal foil sheet having a first side and a second side;

smoothing a first portion of both sides of the sheet;

advancing the sheet by a unit length segment and forming second smoothed portions on a following segment;

heating the first smoothed portions and coating the first smoothed portions with at least one metal layer while under a vacuum; and forming a disc from within the first smoothed portions to form a recording medium.

14. A method as in claim 13, wherein the smoothing step comprises rotating an abrasive surface on the first and second sides of the sheet.

15. A method as in claim 13, further comprising buffing the first and the second sides of the sheet at the smoothed portions after receiving the metal layer.

16. A method as in claim 13, wherein the forming step comprises punching the disc from the sheet.

17. A method as in claim 13, wherein the forming step comprises cutting an inner diameter of the disc, mounting a hub within the inner diameter, and cutting an outer diameter of the disc which is concentric with the hub.

18. A method as in claim 13, further comprising repeating the heating, coating and disc forming steps on the following segment as the following segment is advanced by unit length segments.

19. A method as in claim 13, further comprising heating and cooling the sheet to relieve residual stresses.

20. A method as in claim 19, further comprising pressing polished and flat surfaces against the sides of the sheet coincidentally with the stress relieving step.

21. A method as in claim 13, wherein the sheet is provided on a roll, and further comprising unrolling the sheet from the roll.

22. A method for treating a metal foil sheet having a first side and a second side, the method comprising:

providing a pair of pads which each comprise a compliant material and an abrasive surface on the compliant material;

positioning the metal foil sheet between the pair of pads;

compressing the sheet between the pads such that the first and second sides of the sheet are adjacent the abrasive surfaces; and rotating the pads to produce smoothed portions on the first and the second sides.

23. A method as in claim 22, wherein the compressing step comprises pressing one of the pads against the other pad to obtain a pressure against the sheet which is in the range from about 2 psi to about 15 psi.

24. A method as in claim 22, further comprising rotating the pads at a rate in the range from about 60 rpm to about 1800 rpm.

25. A method as in claim 22, further comprising rotating the pads over an area that is larger than a disc region from which a disc is to be subsequently removed.

26. A method as in claim 22, further comprising moving a center of rotation of the pads while rotating the pads.

27. A method as in claim 22, further comprising releasing the pads, advancing the sheet, again compressing the sheet between the pads and rotating the pads to produce another set of smoothed portions.

28. A method as in claim 27 wherein the advancing step comprises clamping a portion of the sheet with a clamping mechanism and moving the clamping mechanism a unit length amount.

29. A method as in claim 22, further comprising securing the sheet while rotating the pads.

30. A method as in claim 29, wherein the securing step comprises clamping the sheet between a pair of arms.

31. A system for treating a metal foil sheet having a first side and a second side, the system comprising:

a pair of pads which each comprise a compliant material and an abrasive surface on the compliant material;

a mounting system to mount the pads such that the abrasive surfaces generally face each other so that a metal foil sheet is capable of being advanced between the surfaces;

an actuation system to move the pads toward each other such that the sheet is adapted to be compressed between the pads;

a rotation system to rotate the pads; and an advancement mechanism which is adapted to advance the sheet between the pads.

32. A system as in claim 31, further comprising a rigid mandrel coupled to each pad.

33. A system as in claim 32, wherein at least one of the mandrels is supported by a mechanism that allows the mandrels to conform to each other when compressed against the pad.

34. A system as in claim 31, wherein the abrasive surface comprises a polyester felt.

35. A system as in claim 31, wherein the abrasive surface comprises a slurry.

36. A method for coating portions of a metal foil sheet with at least one layer of a metal, the method comprising:

placing an elongate metal foil sheet into a vacuum chamber and applying a vacuum, the sheet having a first side and a second side, and wherein the first and second sides each have at least one smoothed region;

heating the sheet;

depositing at least one metal layer on the smoothed regions; and removing the sheet from the vacuum wherein the heating and depositing steps are performed at a processing station, and further comprising advancing the sheet through a plurality of other processing stations in equal unit length segments such that each segment receives the same treatment as it proceeds through the processing stations.

37. A method as in claim 36, further comprising advancing the sheet a unit length amount so that another smoothed region on each side of the sheet is positioned to receive a metal layer, and repeating the heating and depositing steps.

38. A method as in claim 36, further comprising applying a voltage to the sheet during the depositing step.

39. A method as in claim 36, wherein at least a portion of the sheet extends outside the vacuum chamber during the depositing step.

40. A method as in claim 36, wherein the sheet is wound on rolls, and further comprising placing the rolls within the vacuum chamber.

* * * * *